(12) United States Patent
Minuti et al.

(10) Patent No.: US 9,219,491 B2
(45) Date of Patent: Dec. 22, 2015

(54) ANALOG-TO-DIGITAL CONVERSION DEVICE

(71) Applicant: ST-Ericsson SA, Plan-les-Ouates (CH)

(72) Inventors: Alberto Minuti, Milan (IT); Francesca Girardi, Milan (IT); Germano Nicollini, Piacenza (IT); Marco Zamprogno, Milan (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/412,747

(22) PCT Filed: Jul. 17, 2013

(86) PCT No.: PCT/EP2013/065111
§ 371 (c)(1),
(2) Date: Jan. 5, 2015

(87) PCT Pub. No.: WO2014/016185
PCT Pub. Date: Jan. 30, 2014

(65) Prior Publication Data
US 2015/0171881 A1    Jun. 18, 2015

Related U.S. Application Data

(60) Provisional application No. 61/679,155, filed on Aug. 3, 2012.

(30) Foreign Application Priority Data

Jul. 27, 2012   (EP) ..................................... 12178324

(51) Int. Cl.
*H03M 1/12* (2006.01)
*H02J 7/00* (2006.01)

(52) U.S. Cl.
CPC ................ *H03M 1/12* (2013.01); *H03M 1/129* (2013.01); *H02J 7/00* (2013.01)

(58) Field of Classification Search
CPC .............................. H03M 1/129; H03M 1/183
See application file for complete search history.

(56) References Cited

U.S. PATENT DOCUMENTS 4,942,399 A * 7/1990 Buchholtz et al. ............ 341/143
5,796,361 A * 8/1998 Levinson ...................... 341/172
(Continued)

FOREIGN PATENT DOCUMENTS

JP         2006-153740 A     6/2006

OTHER PUBLICATIONS

Legible copy Gerstenbaber from applicants' IDS.*
(Continued)

*Primary Examiner* — Howard Williams
(74) *Attorney, Agent, or Firm* — Patent Portfolio Builders PLLC

(57) ABSTRACT

An electronic analog-to-digital conversion device includes an analog-to-digital conversion block having a first input for receiving a voltage signal to be converted based on a reference voltage signal provided to a second input, and an input block connected to the first input of the analog-to-digital conversion block. The input block receives an input signal at a first resistive network connected to a second resistive network, which is then connected to a reference potential. The input block also includes an active network connected between an output of the first resistive network and the first input of the analog-to-digital conversion block. The active network has a first input terminal directly connected to the second input of the analog-to-digital conversion block for receiving the same reference voltage signal so that the input voltage signal received at a second input of the active network is processed based on the reference voltage signal.

19 Claims, 5 Drawing Sheets

(56) References Cited

U.S. PATENT DOCUMENTS

| | | | |
|---|---|---|---|
| 5,874,909 A * | 2/1999 | Soenen et al. | 341/141 |
| 7,049,989 B2 * | 5/2006 | Runals et al. | 341/139 |
| 2003/0231130 A1 | 12/2003 | Confalonieri et al. | |
| 2009/0172614 A1 | 7/2009 | Camara et al. | |
| 2010/0308921 A1 | 12/2010 | Adamski et al. | |

OTHER PUBLICATIONS

International Search Report issued in corresponding International application No. PCT/EP2013/065111, date of mailing Aug. 2, 2013.
Written Opinion of the International Searching Authority issued in corresponding International application No. PCT/EP2013/065111, date of mailing Aug. 2, 2013.
Extended European Search Report issued in corresponding European application No. EP 12 17 8324, date of completion of the search Jan. 16, 2013.
Gerstenhaber, Moshe et al., "ADC Interface Conditions High-Level Signals," Electrical Design News, Reed Business Information, Highland Ranch, CO, US, vol. 48, No. 24, Oct. 30, 2003, pp. 96 and 98, XP001177623, ISSN: 0012-7515.
Volpi, Emilio, et al., "Design of a high voltage fully differential driver for a double axis scanning micromirror," IEEE Research in Microelectronics and Electronics, Jul. 12, 2009, Piscataway, NJ, US, pp. 112-115, XP031510377, ISBN: 978-1-4244-3733-7.

* cited by examiner

ANALOG-TO-DIGITAL CONVERSION DEVICE

TECHNICAL FIELD

The present disclosure relates to the field of Analog-to-Digital Converters (ADCs) and more particularly concerns an electronic analog-to-digital conversion device.

BACKGROUND ART

In many electronic applications, a measure of analog single-ended low frequency signals is often required. Usually, a General-Purpose Analog-to-Digital Converter or GPADC is used to convert such analog signals from the analog domain to the digital domain while measuring them. One of these electronic applications is, for example, mobile phones wherein many analog signals have to be continuously monitored to keep the microprocessor equipping each mobile phone device aware of the state of the device itself.

According to the analog-to-digital conversion procedure, an analog signal to be converted, for example a voltage signal having a respective range of variation, is compared to a reference range often indicated as Full Scale Range or FSR. Usually, a single FSR is provided whereas different signals to be converted can have each a different range. In view of this, scaling voltage signals before starting the analog-to-digital conversion is a common practice in order to align the ranges of such voltage signals to the reference range. Moreover, most of the voltage signals to be converted are single-ended signals and referred to ground, whereas few voltage signals have their respective ranges shifted with respect to the ground reference. Therefore, for such few voltage signals also a shifting of the voltage signal's range is required.

An example of a shifted voltage signal is the battery voltage in mobile phones. The analog-to-digital conversion of the battery voltage is always required in such devices. For example, the battery voltage range having a minimum value of 2.3V (battery low) and a maximum value of 4.8V (battery charged) is usually converted using a reference FSR=1.6V. In this case, the battery range is 4.8V−2.3V=2.5V and such range is scaled into 1.6V range by applying 1.6V/2.5V=0.64 as a scaling factor. After the scaling process, the resulting range is:

$$V_{min} = (2.3V*0.64) = 1.472V$$

$$V_{max} = (4.8V*0.64) = 3.072V.$$

Furthermore, a voltage shifting is required as indicated above. This is obtained by subtracting the minimum scaled voltage $V_{min}$ to both voltages resulting from the scaling process, so that:

$$V_{min1} = (1.472V - 1.472V) = 0V; \; V_{max1} = (3.072V - 1.472V) = 1.6V.$$

It should be observed that whereas a voltage scaling can be implemented with an electronic circuit without efforts, voltage shifting is much more complicated to be circuitally implemented.

A well-known solution in the art to convert a analog battery voltage into a digital domain is based on charge redistribution provided by a GPADC device operating with a Successive Approximation Register or SAR. A General-Purpose ADC SAR device is disclosed, for example, in document US 2003/0231130 A1.

FIG. 3 of the present application shows an exemplary structure of a GPADC SAR device 500 known in the art.

The GPADC SAR device 500 comprises a comparator 501 having a first input A connected to a capacitive DAC array 502 for providing a voltage representing the difference between a sampled input voltage $V_M$, applied to a first input terminal 1 of the device 500, and a fraction of a reference voltage $V_{REF}$, applied to a second input terminal 2 of the same device. Such fraction is obtained by connecting only a portion of the capacitors of the array 502 to the reference voltage $V_{REF}$. This operation is managed by a SAR algorithm controller. A second input B of the comparator 501 and a third input terminal 12 of the GPADC device 500 are both connected to the ground potential GND. The input voltage signal $V_M$ of the GPADC SAR device 500 is sampled and stored on the DAC capacitive array 502. This solution is both simple and has the advantage to allow the scaling down of the input voltage $V_M$ stored in the DAC 502 to a voltage equal to the reference voltage $V_{REF}$ only by charging a prefixed fraction of capacitors comprised in the DAC array 502.

In the GPADC SAR device 500, the voltage shifting is achieved by adding a further capacitor, particularly capacitor $C_{AUX}$ in FIG. 3, to the summing node of the capacitive array 502 corresponding to the first input A of comparator 501. In the case of a battery voltage shifting, the additional capacitor $C_{AUX}$ is substantially as big as the whole capacitive array 502. For example, assuming the input voltage signal $V_M$ in the range (2.3V-4.8V), a value for the additional capacitor $C_{AUX}$ is obtained by the equation:

$$C_{AUX} = C_{array} \cdot \frac{2.3\,V}{(4.8 - 2.3)V} = 0.92 \cdot C_{array} \tag{1'}$$

wherein $C_{array}$ corresponds substantially to the total capacitance of the capacitive array 502. Therefore, the resulting area occupation of such array 502 is roughly doubled.

Moreover, the total capacitances connected to the first A input of comparator 501 increases the voltage attenuation of both the input voltage signal $V_M$ and the comparison voltage generated by the SAR algorithm. Therefore, the signal to noise ratio S/N at the input of the comparator 501 is significantly worsened. Such disadvantage of the GPADC SAR device 500 is particularly relevant in new technologies wherein supply voltages are gradually reduced.

The GPADC SAR device 500 has further disadvantages. In fact, since the input voltage signal $V_M$ to be converted can reach a value up to 4.8V (corresponding to the fully charged battery), a voltage of the same value has to be made available inside the GPADC SAR device 500. In recent technologies, for example for a 40 nm manufacturing process or subsequent, reliability issues appear if the voltage inside the circuit overcome very limited values as 3.3V or even 2.5V: so many modifications have to be introduced to manage such a battery voltage value inside the device 500 which lead to area and complexity increases as well as growth in power consumption.

In an alternative solution described with reference to FIG. 4, a resistive voltage divider 600 can be provided at the input of the GPADC SAR device 500. Particularly, such voltage divider 600 comprises resistors $R_A$, $R_B$ to scale the input voltage $V_M$ in order to generate a properly scaled voltage $V_M'$ at the input of the GPADC SAR device 500. However, the voltage shifting is still performed inside the GPADC SAR device 500 by using the above mentioned additional capacitor $C_{AUX}$.

Such alternative solution ensures a complexity reduction of the GPADC SAR device 500 compared with the previous one and, therefore, is more reliable. However, with reference to the chip area occupation involved, even if the additional area occupied by the resistive voltage divider would probably compensate for the area saved inside the GPADC SAR device 500 determined by reliability drawbacks prevention, the area required for voltage shifting, which is influenced by capacitor $C_{AUX}$, is not reduced at all. Therefore, also such alternative solution suffers of a non negligible increase in area occupation.

SUMMARY OF THE INVENTION

It is an object of the present invention to provide an electronic analog-to-digital conversion device for converting a voltage signal into a digital signal which ensures better performances in term of chip area saving if compared to the known solutions.

Another object of the invention is to provide an electronic analog-to-digital conversion device which ensures better performances in term of noise immunity if compared to the known solutions.

The above objects are reached by an electronic analog-to-digital conversion device according to independent claim 1. Such conversion device comprises:

an analog-to-digital conversion block having a first input for receiving a voltage signal to be converted on the basis of a reference voltage signal provided to a second input of the same analog-to-digital conversion block;

an input block having an input terminal and an output terminal connected to the first input of the analog-to-digital conversion block.

The input block is arranged for processing an input voltage signal applied to the input terminal to generate the voltage signal at the output terminal. The input block comprises:

a first resistive network operatively connected to both the input terminal and the output terminal;

a second resistive network connected between the output terminal and a reference potential.

The input block is characterized by comprising an active network connected between an output node of the first resistive network and the output terminal. The active network has a first input terminal directly connected to the second input of the analog-to-digital conversion block for receiving the same reference voltage signal provided to the second input so that the input voltage signal is processed by the input block on the basis of such reference voltage signal.

Further embodiments of the invention are described in the dependent claims 2-18.

It is an object of the present invention also a portable communication apparatus in accordance with claim and a method for converting a voltage signal in accordance with claim 20.

BRIEF DESCRIPTION OF THE DRAWINGS

Further features and advantages of the present invention will become more apparent from the following detailed description of exemplary but non-limiting embodiments thereof, as illustrated in the attached figures, in which.

DETAILED DESCRIPTION

In the attached figures similar or identical elements are indicated using the same reference numbers.

Figure 1:
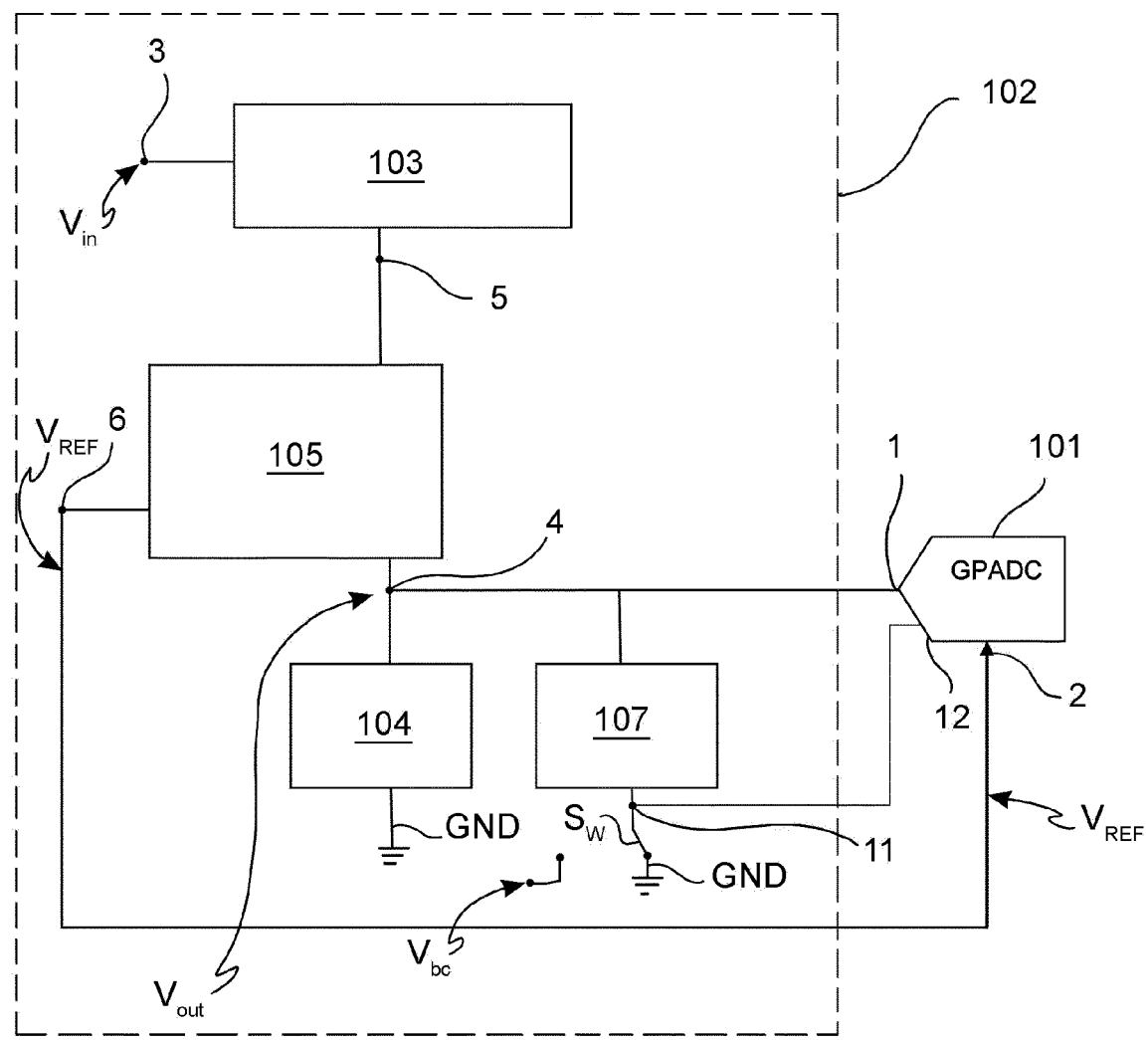
FIG. 1 shows schematically a block structure of an electronic analog-to-digital conversion device according to the present invention.

With reference to FIG. 1, a block structure of an electronic analog-to-digital conversion device according to the present invention is indicated with the reference number 100. In the following the electronic analog-to-digital conversion device 100 is also indicated AD conversion device or simply conversion device.

Such AD conversion device 100 can be used in many electronic applications wherein a conversion of analog voltage signals from the analog domain to the digital domain is required. In more detail, the present invention can be advantageously used in portable communication apparatuses, such as for example mobile phones, smart-phones or tablets, wherein many analog voltage signals have to be continuously converted and such signals have each a respective range of variation which is also shifted with respect to a ground reference. Therefore, shifting and scaling operations performed on such voltage signals before starting the analog-to-digital conversion are necessary.

Figure 3:
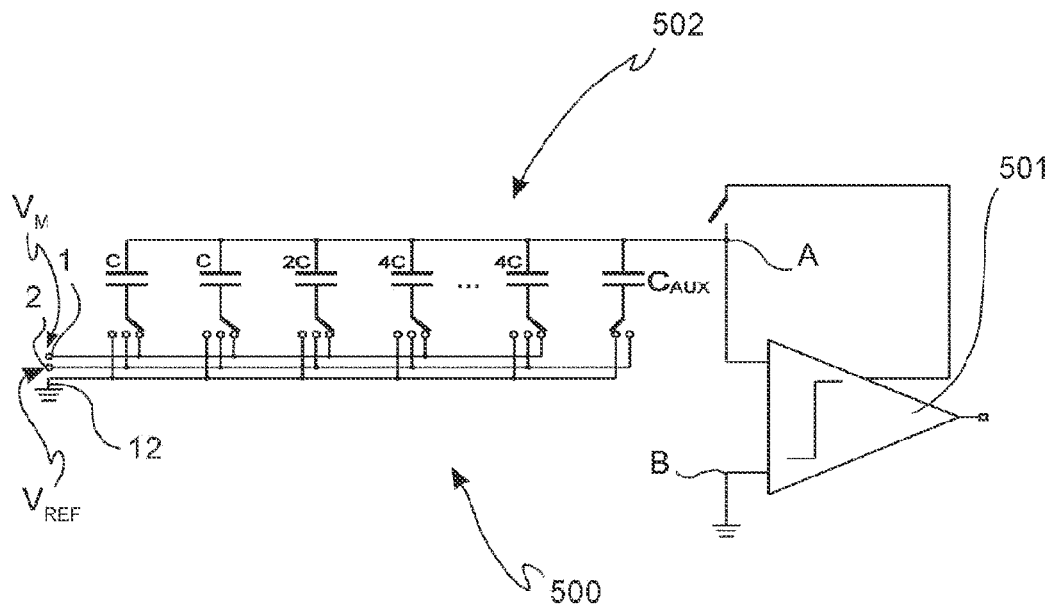
FIG. 3 shows a schematic circuital structure of a General Purpose Analog-to-Digital Converter (GPADC) operating with a Successive Approximation Register (SAR) in accordance with a solution known in the art.
Figure 4:
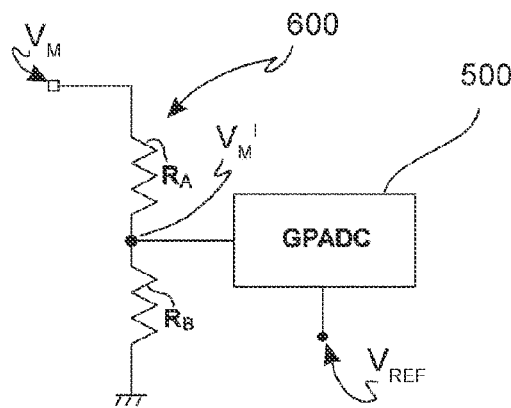
FIG. 4 shows schematically the GPADC device of FIG. 3 having its input connected to a resistive voltage divider known in the art.

Particularly, the AD conversion device 100 comprises an analog-to-digital conversion block 101 and an input block 102. The analog-to-digital conversion block 101 comprises a first input 1 for receiving a voltage signal Vout to be converted on the basis of a reference voltage signal $V_{REF}$ provided to a second input 2 of the same analog-to-digital conversion block 101. Such analog-to-digital conversion block 101 corresponds to a General-Purpose Analog-to-Digital Converter or GPADC known in the art (see for example, FIG. 3) and it will not be described in more detail in the following.

The input block 102 comprises an input terminal 3 for receiving an input voltage signal Vin and an output terminal 4 which is connected to the first input 1 of the analog-to-digital conversion block 101. Particularly, the input block 102 is arranged for processing the input voltage signal Vin applied to the input terminal 3 to generate such voltage signal Vout at the output terminal 4. For example, the input voltage signal Vin is an analog voltage signal representing the battery voltage of a mobile-phone, smart-phone or tablet.

In an embodiment, such input voltage signal Vin can assume values in a range between a maximum value $Vin_{max}$ and a minimum value $Vin_{min}$. In a further embodiment, the minimum value $Vin_{min}$ of the input voltage signal Vin is greater than 0. With reference to the example above, the maximum value $Vin_{max}$ is about 4.8V, corresponding to a battery fully charged, and the minimum value $Vin_{min}$ is about 2.3V, corresponding to a battery low.

Moreover, in the present disclosure, the term "processing" the input voltage signal Vin generally indicates both shifting and scaling operations performed on the same input voltage signal Vin by the input block 102 to generate the voltage signal Vout to be provided to the analog-to-digital conversion block 101.

Moreover, the input block 102 comprises a first resistive network 103 operatively connected both to the input terminal 3 and to the output terminal 4. In more detail, with reference to FIG. 2, such first resistive network 103 comprises a first resistor $R_1$ directly connected to the input terminal 3 and to an output node 5 of the first resistive network 103. Such output node 5 is operatively connected to the output terminal 4.

Figure 2:
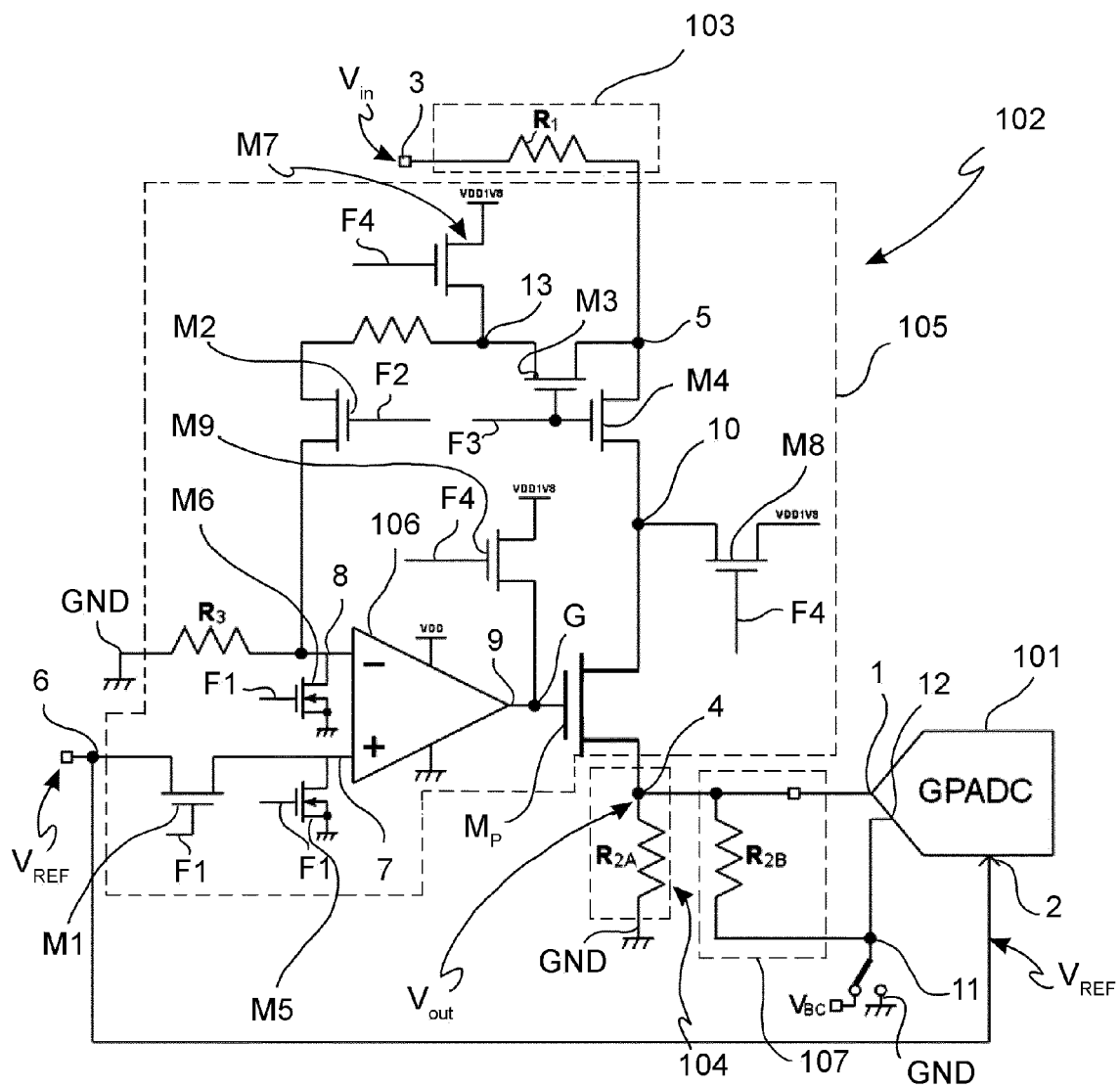
FIG. 2 shows a circuital structure of a preferred embodiment of the electronic analog-to-digital conversion device of FIG. 1.

The input block 102 also comprises a second resistive network 104 connected between the output terminal 4 and a reference potential, such as the ground potential GND. With reference to FIG. 2, such second resistive network 104 comprises a second resistor $R_{2A}$.

In addition, the input block 102 comprises an active network 105 connected between the output node 5 of the first resistive network 103 and the output terminal 4. Such active network 105 has, advantageously, a first input terminal 6 directly connected to the second input 2 of the analog-to-digital conversion block 101 for receiving the same reference voltage signal $V_{REF}$ applied to such second input 2 of the conversion block 101. In this way the input voltage signal Vin is processed (e.g., scaled and shifted) by the input block 102 on the basis of such reference voltage signal $V_{REF}$.

With reference to FIG. 2, the active network 105 comprises an operational amplifier 106 having a first 7 and a second 8 differential input and a single-ended output 9. Such operational amplifier 106 is connected between a first supply potential VDD corresponding to the conversion device 100 supply potential, and the ground potential GND. Such first supply potential VDD is lower than the battery voltage Vin and is generated starting from such battery voltage.

The first differential input 7 of the operational amplifier 106 is connected to the first input terminal 6 above mentioned through a first electronic circuit M1. The second differential input 8 is connected to the output node 5 of the first resistive network 103 through a second electronic circuit M2, $R_4$, M3.

In more detail, the first electronic circuit M1 comprises a first pass-transistor M1, for example a P-MOS transistor, connected between the first differential input 7 of the operational amplifier 106 and the first input terminal 6 of the active network 105. A command terminal of such first pass-transistor M1 is driven by a first control voltage F1.

The second electronic circuit M2, $R_4$, M3 comprises a second M2 (P-MOS type) and a third M3 (P-MOS type) pass-transistor with a resistor $R_4$ in between so that the second M2 and third M3 pass-transistors and such resistor $R_4$ are connected in series between the second differential input 8 of the operational amplifier 106 and the output node 5 of the first resistive network 103. The second M2 and the third M3 pass-transistor have command terminals driven by a second control voltage F2 and by a third control voltage F3, respectively.

Furthermore, the active network 105 comprises an output stage $M_P$, M4 connected between the above mentioned output node 5 of the first resistive network 103 and the output terminal 4. Such output stage comprises a transistor $M_P$, for example a P-MOS transistor, having a first current terminal 10 connected to the output node 5 through a fourth pass-transistor M4, and a second current terminal connected to said output terminal 4. A command terminal G representing the activation terminal for transistor $M_P$ is connected to the single-ended output 9 of the operational amplifier 106.

It should be observed that the fourth pass-transistor M4 is a P-MOS having a respective command terminal driven by the third control voltage F3.

Moreover, the active network 105 comprises a further resistor $R_3$ connected between the second differential input 8 of the operational amplifier 106 and the ground potential GND.

The active network 105 of the conversion device 100 further comprises a fifth M5/a sixth M6 pass-transistor connected between the first 7/the second 8 differential input of the operational amplifier 106 and the ground potential GND. Both fifth M5 and a sixth M6 pass-transistors are N-MOS having a command terminal driven by the first control voltage F1.

Moreover, the active network 105 comprises a seventh pass-transistor M7 (P-MOS type) connected between a second supply potential VDD1V8 and a node 13 interposed between the third M3 pass-transistor and the resistor $R_4$. This second supply potential VDD1V8 is a system voltage which is available in the system when the battery voltage Vin is above the minimum voltage value $Vin_{min}$. In this condition, such second supply potential VDD1V8 is available in the system even if the first supply potential VDD is off.

A eighth pass-transistor M8 (P-MOS type) is connected between the same second supply potential VDD1V8 and the first current terminal 10 of PMOS transistor Mp. A ninth pass transistor M9 (P-MOS type) is connected between the second supply potential VDD1V8 and the single-ended output 9 of the operational amplifier 106. All pass-transistors M7, M8 and M9 have their command terminals driven by a fourth control voltage F4.

It should be observed that the above mentioned control voltages—F1-F4 are digital signals that can assume either a low level (logic 0) or a high level (logic 1). Therefore, all the above mentioned pass-transistors transistors M1-M9 can assume ON/OFF state on the basis of such digital signals F1-F4 applied to their command terminals.

Figure 7:
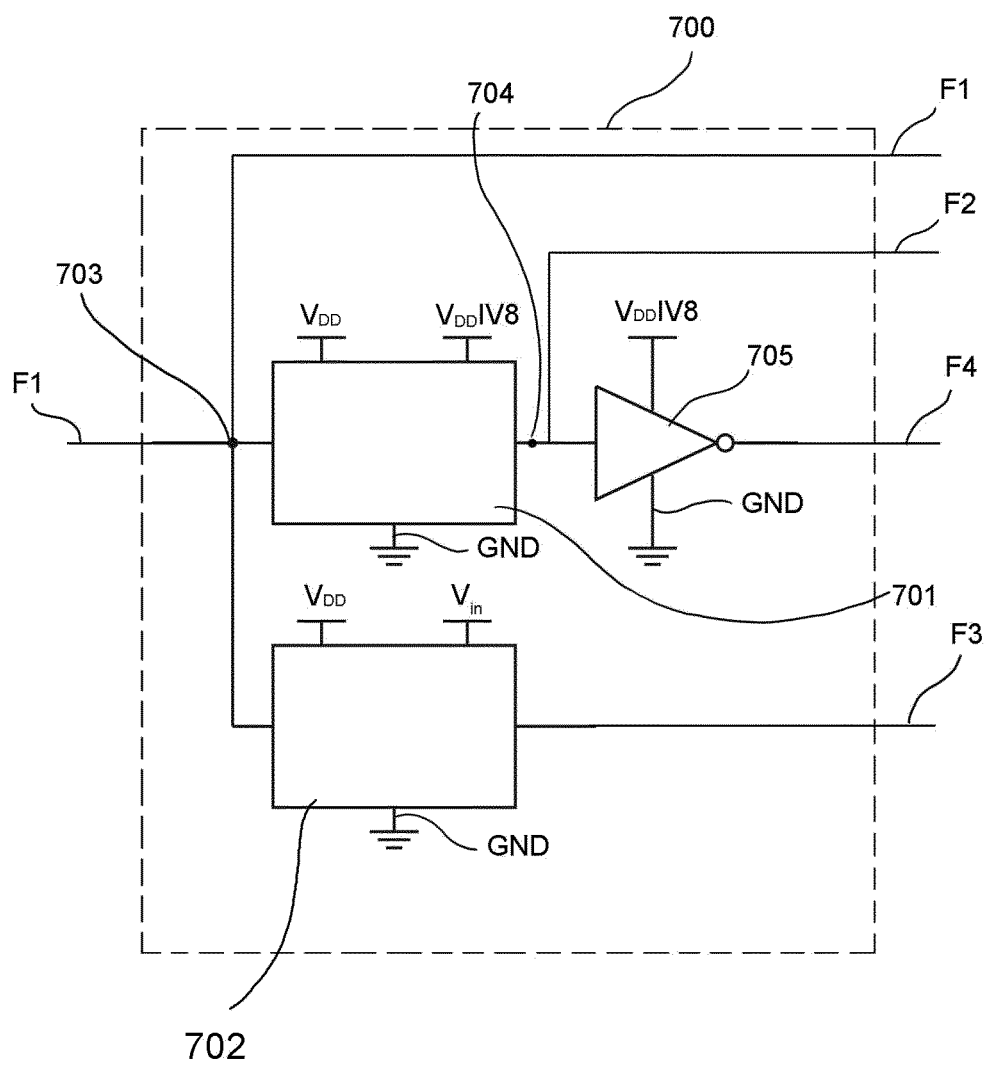
FIG. 7 shows schematically a control circuit for generating control voltages to drive pass-transistors of the analog-to-digital conversion device of FIG. 2.

An example of a control circuit 700 for generating control voltages F1-F4 to drive pass-transistors M1-M9 is shown in FIG. 7. Such control circuit 700 is, particularly, arranged to receive as input the first control voltage F1 and to generate as output the second F2, third F3 and fourth F4 control voltage. The control circuit 700 is also arranged to provide the same first control voltage F1 as output.

It should be observed that the first control voltage F1 is generated by a logic circuitry associated with the analog-to-digital conversion block 101 for controlling such block. The low logic level of the first control voltage F1 corresponds to the ground potential GND, the high logic level of the same first control voltage F1 corresponds to the first supply potential VDD.

In a preferred embodiment, the control circuit 700 comprises a first 701 and a second 702 level shifting block, particularly a first 701 and a second 702 dual supply level shifter. In more detail, the first level shifter 701 is connected between the first VDD and the second VDD1V8 supply potential and the ground potential GND. The second level shifter 702 is connected between the first VDD supply potential, the battery voltage Vin and the ground potential GND.

The first level shifter 701 comprises an input 703 for receiving the first control voltage F1 and an output 704 for providing the second control voltage F2 as result of the level shifting operation performed on the first control voltage F1. The second control voltage F2 has its low logic level corresponding to the ground potential GND and its high logic level corresponding to the second supply potential VDD1V8.

The second level shifter 702 has its input connected to the same input 703 of the first level shifter 701 for receiving the first control voltage F1. The second level shifter 702 is configured to provide as output the third control voltage F3 resulting from the shifting of such first control voltage F1. The third control voltage F3 has its low logic level corresponding to the ground potential GND and its high logic level corresponding to the battery voltage Vin.

In addition, the control circuit 700 comprises an inverter 705 connected between the second supply potential VDD1V8 and the ground potential GND. Such inverter 705 has its input connected to the output 704 of the first level shifter 701 to receive the second control voltage F2. The inverter 705 is arranged to generate as output the fourth control voltage F4 which has its low logic level corresponding to the ground potential GND and its high logic level corresponding to the second supply potential VDD1V8.

With reference to FIG. 2, pass-transistors M5-M6 have their bulk nodes connected to the ground potential GND. Even if not explicitly shown in FIG. 2, the bulk nodes of pass-transistors M1-M4, M7-M9 and of transistor $M_p$ are connected to the higher voltage in the circuit, i.e. the battery voltage Vin.

The input block 102 of the AD conversion device 100 of the invention comprises the pass-transistors M1-M9 described above to avoid reliability problems that could arise in recent technologies whenever the conversion device 100 itself is put in power-down mode. In fact, for example, in such power-down mode, the output node 5 of the first resistive network 103 would reach the input voltage Vin, i.e. the battery voltage, if no current flows through the first resistor $R_1$. This would result in an excessive increase of drain-source operating voltage across the PMOS transistor $M_P$.

Particularly, the first control voltage F1 assumes its low level (logic 0) when the conversion device 100 is in the active mode to switch-on the first pass-transistor M1 (P-MOS) and to maintain both fifth M5 and sixth M6 pass-transistors (N-MOS) switched-off. To avoid reliability problems, the first control voltage F1 assumes its high level (logic 1) when the conversion device 100 is in the power-down mode to switch-off the first pass-transistor M1 and to switch-on the fifth M5 and sixth M6 pass-transistors.

As described with reference to FIG. 7, the second F2 and fourth F4 control voltage are complementary logical signal having, for example, their respective high levels shifted to the second supply potential VDD1V8. In more detail, when the conversion device 100 is in the active mode, the second control voltage F2 assumes its low level, i.e. GND, to switch-on the second pass-transistor M2, and the fourth control voltage F4 assumes the high level to maintain the seventh M7, the eighth M8 and ninth M9 pass-transistors switched-off. To avoid reliability problems, when the conversion device 100 is in the power-down mode, the second F2 and fourth F4 control voltage are configured to switch-off the second pass-transistor M2 and to switch-on the seventh M7, the eighth M8 and ninth M9 pass-transistor, respectively.

The third control voltage F3 is a digital signal having its high level shifted to the battery voltage Vin. In more detail, when the conversion device 100 is in the active mode, the third control voltage F3 assumes its low level to switch-on both the third M3 and the fourth M4 pass-transistor. When the conversion device 100 is in the power-down mode, the third control voltage F3 is high to switch-off both pass-transistors M3 and M4.

It should be observed that pass-transistors M3 and M4 allow, advantageously, to disconnect the first resistor $R_1$, and therefore also the input voltage Vin, from the input block 102 when the conversion device 100 is in such power-down mode. In addition, in the power-down mode, pass-transistors M7 and M8 connect, respectively, the intermediate node 13 and the first current terminal 10 to the second supply potential VDD1V8. Therefore, it is guaranteed that, even in power-down mode, the drain-source voltages of both P-MOS transistor $M_P$ and pass-transistors M3, M4 are maintained under their maximum operative voltage.

During the power-down mode of conversion device 100, pass-transistors M5, M6, M9 reset the operational amplifier 106 by isolating it from the remaining circuitry. In addition, the second pass-transistor M2 is switched-off in power-down mode to avoid current consumption between the second supply potential VDD1V8 and ground GND through the resistive path defined by the resistor $R_4$.

Furthermore, for the analog-to-digital conversion of a battery voltage in the most recent mobile-phones and smart-phones, the following situation can arise. The smart-phone battery is usually connected to a modem/application processor chip so that a sense resistance is present between the ground potential GND of the chip and the battery cathode. Since this sense resistance is of the order of tens of milliohms, the voltage drop across it has been for long time considered negligible. Since nowadays the current consumption for smart-phones and tablets is rising, the voltage drop across the sense resistance can reach a relevant value of e.g. one hundred millivolts.

For these reasons, in smart-phones and tablets is now of interest to convert the battery voltage Vin both versus the ground potential GND, which can be considered the effective voltage available for the system, and also versus the battery cathode, i.e. a first reference potential Vbc, in order to have an accurate measurement of the battery voltage itself or "true" battery voltage.

In view of this, with reference to FIGS. 1 and 2, the input block 102 of the conversion device 100 of the invention further comprises an optional third resistive network 107 connected between the output terminal 4 and a first output node 11 of the same input block 102. Such first output node 11 is connected to a third input 12 of the analog-to-digital conversion block 101.

In more detail, the first output node 11 is configured to be switched, through a switch Sw, to the ground potential GND in a first operative condition of the conversion device 100, i.e. when the battery voltage Vin has to be converted versus the ground potential GND. In a second operative condition of the conversion device 100, i.e. when the battery voltage Vin has to be converted versus the first reference potential Vbc, the first output node 11 is connected by the switch Sw to such first reference potential Vbc.

With reference to FIG. 2, the third resistive network 107 comprises a third resistor $R_{2B}$ connected between the output terminal 4 and the first output node 11 of the input block 102.

Figure 5:
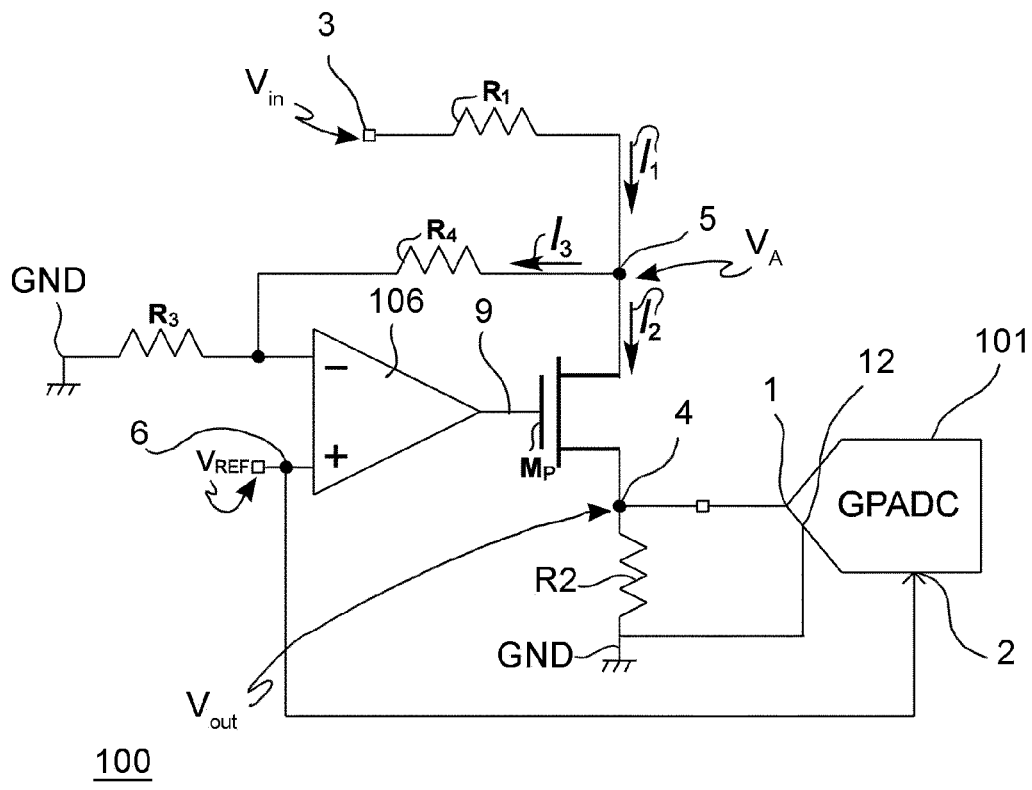
FIG. 5 shows the electronic analog-to-digital conversion device of FIG. 2 in active mode and in a first operative condition.

A way of operating of the AD conversion device 100 for converting the battery voltage Vin can be described with reference to FIGS. 5 and 6. Particularly, the AD conversion device 100 in the active mode and in the first operative condition is shown in FIG. 5. In such FIG. 5, a parallel connection of the second $R_{2A}$ and third $R_{2B}$ resistor is represented by a fourth resistor $R_2$.

With reference to FIG. 5, a voltage $V_A$ at the output node 5 is fixed by the negative feedback of a buffer loop comprising the operational amplifier 106, the resistors R3 and R4, and the P-MOS transistor $M_P$.

More in detail, a current $I_3$ flowing in the feedback branch of the buffer comprising resistors R3 and R4 can be expressed by:

$$I_3 = V_{REF}/R_3$$

Thus, the voltage $V_A$ at the output node 5 is:

$$V_A = V_{REF} \cdot \frac{R_3 + R_4}{R_3} \quad (2)$$

A first current $I_1$ flowing in the first resistor R1 is:

$$I_1 = \frac{V_{in} - V_A}{R_1} \qquad (3)$$

Since the P-MOS transistor $M_P$ acts as a current follower, the current flowing through it, i.e. a second current $I_2$, is:

$$\begin{aligned} I_2 &= I_1 - I_3 \qquad (4) \\ &= \frac{V_{in} - V_A}{R_1} - I_3 \\ &= \frac{V_{in}}{R_1} - \frac{R_3 + R_4}{R_1} \cdot I_3 - I_3 \\ &= \frac{V_{in}}{R_1} - \frac{R_1 + R_3 + R_4}{R_1} \cdot \frac{V_{REF}}{R_3} \end{aligned}$$

The resulting voltage signal Vout generated by the input block 102 is, therefore:

$$V_{OUT} = I_2 \cdot R_2 = \left(\frac{V_{in}}{R_1} - \frac{R_1 + R_3 + R_4}{R_1} \cdot \frac{V_{REF}}{R_3}\right) \cdot R_2 \Rightarrow \qquad (5)$$

$$V_{OUT} = \frac{R_2}{R_1} \cdot V_{in} - \frac{R_2}{R_3} \cdot \frac{(R_1 + R_3 + R_4)}{R_1} \cdot V_{REF}$$

The first term of the expression (5) of the voltage signal Vout depends on the battery voltage Vin. The factor of this dependence is the scaling factor (R2/R1).

The second term of expression (5) depends on the reference voltage $V_{REF}$, which is the internal reference voltage (Full Scale Range or FSR) of the GPADC conversion block 101. This term is negative, so that, it produces a downward voltage shifting.

It is relevant to notice that the shifting is proportional to the reference voltage $V_{REF}$. By comparing the output voltage Vout of (5) with the reference voltage $V_{REF}$, from a mathematical point of view, the GPADC conversion block 101 has to manage the ratio:

$$\begin{aligned} \frac{V_{out}}{V_{REF}} &= \frac{\frac{R_2}{R_1} \cdot V_{in} - \frac{R_2}{R_3} \cdot \frac{(R_1 + R_3 + R_4)}{R_1} \cdot V_{REF}}{V_{REF}} \\ &= \frac{R_2}{R_1} \cdot \frac{V_{in}}{V_{REF}} - \frac{R_2}{R_3} \cdot \frac{(R_1 + R_3 + R_4)}{R_1} \end{aligned}$$

So an accurate shifting and scaling can be performed in the limit of the reference voltage $V_{REF}$ precision which is generally well guaranteed in recent design.

In order to ensure a suitable polarization for the input block 102 of the conversion device 100, a maximum value for the voltage signal Vout, i.e. $Vout_{MAX}$, should preferably be sufficiently below the value chosen for the voltage $V_A$ of the output node 5. In this way, the P-MOS transistor $M_P$ is maintained outside its linear operation region. Moreover, the same maximum value of the voltage signal $Vout_{MAX}$ should be low enough to avoid the introduction of reliability problems into the GPADC conversion block 101.

In addition, a minimum value of the voltage signal Vout, i.e. $Vout_{MIN}$, should be sufficiently above 0, for example it can assume a value of tens of millivolts. In fact, when Vout tends to 0, the second current $I_2$ also tends to 0, producing polarization problems for PMOS transistor $M_P$.

In other words, the voltage signal Vout generated at the output terminal 4 as a consequence of scaling and shifting operations performed by the input block 102 on the input voltage signal Vin, can assume values in a respective range between the maximum value $Vout_{MAX}$ and the minimum value $Vout_{MIN}$ above mentioned. Such respective range of values ($Vout_{MAX}$–$Vout_{MIN}$) can be further scaled and shifted by the GPADC conversion block 101. These further scaling and shifting operations can be performed to reach a desired scaled value if the scaling performed by the input block 102 was not enough and to further down-shift the range itself to remove the effect of a non-zero value for $Vout_{MIN}$, i.e. to obtain $Vout_{MIN}$=0 as low value.

For example, assuming that values of the battery voltage Vin are in the range (2.3V-4.8V) and the reference voltage $V_{REF}$=1.6V, the values for resistors $R_1$, $R_2$, $R_3$ and $R_4$ can be chosen for example as:

$R_1$=10 kΩ, $R_2$=6.4 kΩ, $R_3$=216 kΩ, $R_4$=53 kΩ.

These values lead to a range for the voltage signal Vout that is (0.149V-1.749V), allowing a correct polarization for the input block 102 wherein the first supply voltage VDD=2.2V and the voltage of the output node 5 is $V_A$=1.99V.

Since this range is already scaled to the internal FSR, in fact 1.749−0.149=1.6V, no further scaling operation will be requested in the GPADC conversion block 101 for converting the voltage signal Vout into the digital domain. On the other hand a down-shift of 0.149V is needed. This down-shift is performed by the conversion block 101, for example the conversion block of FIG. 3. In more detail, the requested down-shift is obtained by using an additional capacitor $C_{AUX}$ having a value in accordance with the following equation:

$$C_{AUX} = C_{array} \cdot \frac{149 \text{ mV}}{1.6 \text{ V}} = 0.093 \cdot C_{array} \qquad (6)$$

By comparing equation (6) with the result of equation (1') above, contrary to the solution in accordance with the known art wherein $C_{AUX}$ was 0.92*$C_{array}$, the electronic conversion device 100 of the present invention, advantageously, involves additional capacitor $C_{AUX}$ in the conversion block 101 that are about ten times smaller than the corresponding capacitor of a GPADC converter known in the art.

Particularly, thanks to the area saving resulting from such drastic reduction of additional capacitor $C_{AUX}$ size in the capacitive arrays of GPADC conversion block 101, the conversion device 100 of the invention leads to an area increase which is significantly lower than the increase of the approaches known in the art.

Figure 6:
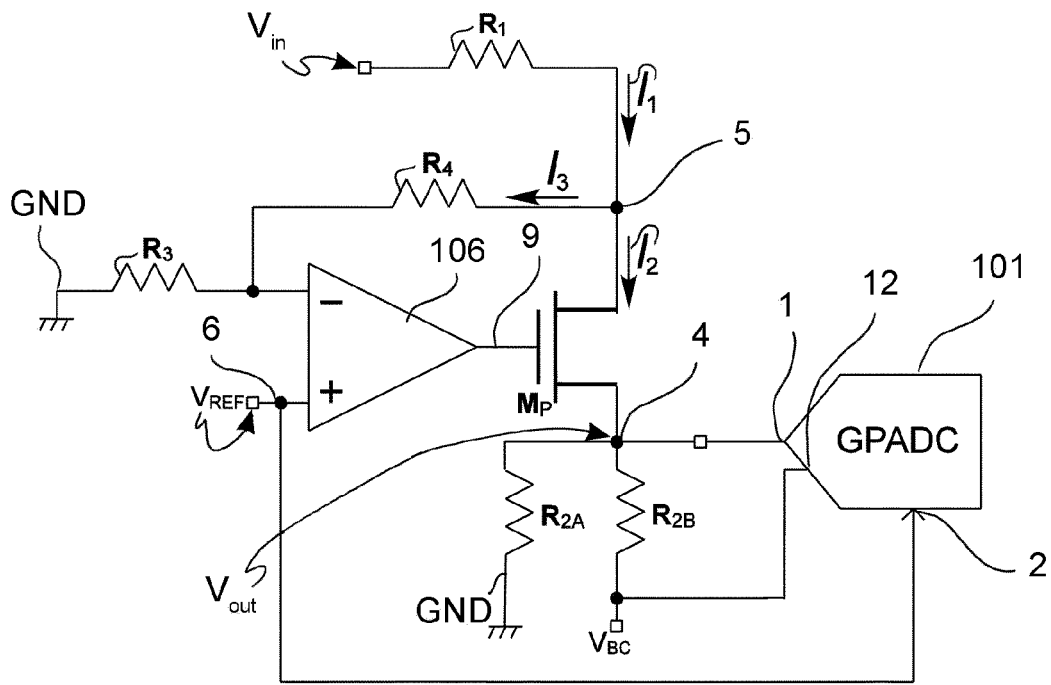
FIG. 6 shows the electronic analog-to-digital conversion device of FIG. 2 in active mode and in a second operative condition.

FIG. 6 shows schematically the AD conversion device 100 of the invention in the active mode and in the second operative condition.

In this case, for a superposition principle, the voltage signal Vout generated by the input block 102 is obtained by the sum of the expression in (5) with another term that takes into account the effect of the first reference potential Vbc through the third resistor R2B. In addition, the input voltage signal Vin in (5) has to be replaced by Vin=Vint+Vbc wherein Vint represents a value of a "true battery", i.e, the battery voltage without the effect of the sense resistance above mentioned. Therefore, the resulting expression is:

$$V_{out} = \qquad (7)$$
$$\frac{R_2}{R_1} \cdot (V_{int} + V_{bc}) - \frac{R_2}{R_3} \cdot \frac{(R_1 + R_3 + R_4)}{R_1} \cdot V_{REF} + \frac{R_{2A}}{(R_{2A} + R_{2B})} \cdot V_{bc}$$

Since the voltage signal Vout to be converted is now referred to the first reference potential Vbc itself, the contribution in expression (7) relating to such first reference potential Vbc can be cancelled with an opportune choice of resistors values. In particular:

$$V_{out} - V_{bc} = \qquad (8)$$
$$\frac{R_2}{R_1} \cdot V_{int} - \frac{R_2}{R_3} \cdot \frac{(R_1 + R_3 + R_4)}{R_1} \cdot V_{REF} + \left(\frac{R_2}{R_1} + \frac{R_{2A}}{(R_{2A} + R_{2B})} - 1\right) \cdot V_{bc}$$

with $$\frac{R_2}{R_1} + \frac{R_{2A}}{(R_{2A} + R_{2B})} - 1 = 0 \Rightarrow \frac{R_2}{R_1} + \frac{R_2}{R_{2B}} = 1 \Rightarrow R_{2B} = \frac{R_2 \cdot R_1}{(R_1 - R_2)} \qquad (9)$$

Therefore, if the third resistor $R_{2B}$ assumes the value indicated in expression (9), the expression (8) represents the scaled/shifted value of the "true battery".

It should be noted that in the conversion device 100 of the invention, the modifications introduced to make "true battery" conversion possible are, advantageously, almost negligible from an area and complexity point of view.

In addition, the input block 102 of AD conversion device 100 of the invention has the advantage of consuming current only during the sampling phase of a battery voltage conversion, otherwise it is powered-down.

Moreover, by requiring to introduce a very limited additional capacitance $C_{AUX}$ into the conversion block 101 (as shown in equation (6)), the invention advantageously allows to have a limited attenuation of the signal at the summing nodes of such block 101, so avoiding an unwanted reduction of the signal-to-noise performance. Referred to this benefit, the noise added by the input block 102 does not affect of the noise performance.

Regarding the embodiments of the electronic conversion device described above, a person skilled in the art, in order to satisfy contingent needs, can make modifications, adaptations and substitutions of elements with other functional equivalent elements, without departing from the scope of the following claims. Each of the features described as belonging to a possible embodiment can be made independent of the other described embodiments.

The invention claimed is:

1. An electronic analog-to-digital conversion device comprising:
   an analog-to-digital conversion block having a first input for receiving a voltage signal to be converted based on a reference voltage signal provided to a second input of said analog-to-digital conversion block;
   an input block having an input terminal and an output terminal connected to the first input of the analog-to-digital conversion block, said input block being arranged for processing an input voltage signal applied to the input terminal to generate said voltage signal at the output terminal, said input block comprising:
      a first resistive network operatively connected to both the input terminal and the output terminal;
      a second resistive network connected between said output terminal and a reference potential; and
      an active network connected between an output node of the first resistive network and said output terminal,
   said active network having a first input terminal directly connected to the second input of the analog-to-digital conversion block for receiving the same reference voltage signal provided to said second input so that the input voltage signal is processed by the input block based on of said reference voltage signal,
   wherein said active network comprises an operational amplifier with
      a first differential input connected to said first input terminal through a first electronic circuit;
      a second differential input connected to the output node of the first resistive network through a second electronic circuit;
      an output stage connected between said output node and said output terminal, said output stage comprising an activation terminal connected to a single-ended output of the operational amplifier.

2. The analog-to-digital conversion device of claim 1, wherein said input voltage signal assumes values in a range between a maximum value and a minimum value.

3. The analog-to-digital conversion device of claim 2, wherein the minimum value of the input voltage signal is greater than 0.

4. The analog-to-digital conversion device of claim 1, wherein said first electronic circuit comprises a first pass-transistor connected between the first differential input of the operational amplifier and said first input terminal and having a command terminal driven by a first control voltage.

5. The analog-to-digital conversion device of claim 4, wherein said active network further comprises:
   a fifth pass-transistor connected between the first differential input of the operational amplifier and the reference potential, having a command terminal driven by the first control voltage; and
   a sixth pass transistor connected between the second differential input of the operational amplifier and the reference potential, having a command terminal driven by the first control voltage.

6. The analog-to-digital conversion device of claim 4, wherein the active network further comprises:
   a seventh pass-transistor connected between a supply potential and a node interposed between the third pass-transistor and the first resistor,
   a eighth pass-transistor connected between the supply potential and the first current terminal of said transistor,
   a ninth pass transistor connected between the supply potential and the single-ended output of the operational amplifier, and
   said seventh, eighth and ninth pass-transistors having their command terminal driven by a fourth control voltage.

7. The analog-to-digital conversion device of claim 1, wherein said second electronic circuit comprises a second and a third pass-transistors and a first resistor connected in series among them between the second differential input of the operational amplifier and the output node, said second pass-transistor having a command terminal driven by a second control voltage and said third pass-transistor having a command terminal driven by a third control voltage.

8. The analog-to-digital conversion device of claim 7, wherein said fourth pass-transistor has a respective command terminal driven by the third control voltage.

9. The analog-to-digital conversion device of claim 1, wherein said output stage comprises a transistor having a first current terminal connected to the output node through a fourth pass-transistor, a second current terminal connected to said output terminal and a command terminal corresponding to said activation terminal.

10. The analog-to-digital conversion device of claim 1, wherein said active network further comprises a second resistor connected between the second differential input of the operational amplifier and the reference potential.

11. The analog-to-digital conversion device of claim 1, wherein said input block further comprises a third resistive network connected between said output terminal and a first output node of the input block.

12. The analog-to-digital conversion device of claim 11, wherein said first output node is connected to said reference potential in a first operative condition of the conversion device.

13. The analog-to-digital conversion device of claim 11, wherein said first output node is connected to a first reference potential in a second operative condition of the conversion device.

14. The analog-to-digital conversion device of claim 11, wherein said first output node is connected to a third input of the analog-to-digital conversion block.

15. The analog-to-digital conversion device of claim 11, wherein said third resistive network comprises a fifth resistor connected between the output terminal and the first output node of the input block.

16. The analog-to-digital conversion device of claim 1, wherein said first resistive network comprises a third resistor connected between the input terminal of the input block and the output node.

17. The analog-to-digital conversion device of claim 1, wherein said second resistive network comprises a fourth resistor connected between the output terminal and the reference potential.

18. A portable communication apparatus comprising the analog-to-digital conversion device according to claim 1.

19. A method for converting a voltage signal based on a reference voltage signal with an electronic analog-to-digital conversion device, said device comprising:

an analog-to-digital conversion block having a first input and a second input;

an input block having an input terminal and an output terminal connected to the first input of the analog-to-digital conversion block, said input block further comprising:
  a first resistive network operatively connected to both the input terminal and the output terminal;
  a second resistive network connected between said output terminal and a reference potential;

an active network connected between an output node of the first resistive network and said output terminal, said active network having a first input terminal directly connected to the second input of the analog-to-digital conversion block, wherein said active network comprises an operational amplifier with a first differential input connected to said first input terminal through a first electronic circuit, a second differential input connected to the output node of the first resistive network through a second electronic circuit, and an output stage connected between said output node and said output terminal, said output stage comprising an activation terminal connected to a single-ended output of the operational amplifier;

the method comprising the steps of:
  providing an input voltage signal to the input terminal of the input block,
  providing the reference voltage signal both to the first input terminal of the active network and to the second input of the analog-to-digital conversion block;
  performing, by the input block, a first scaling and shifting operation on said input voltage signal based on the reference voltage signal to generate said voltage signal applied to said first input;
  performing, by the analog-to-digital conversion block, at least a second shifting operation on said voltage signal.

* * * * *